(12) United States Patent
Aikiyo et al.

(10) Patent No.: US 6,721,341 B2
(45) Date of Patent: Apr. 13, 2004

(54) MOUNTING STRUCTURE FOR SEMICONDUCTOR LASER MODULE

(75) Inventors: Takeshi Aikiyo, Tokyo (JP); Toshio Kimura, Tokyo (JP); Kohei Terada, Tokyo (JP); Takahiro Okada, Tokyo (JP); Takashi Koseki, Tokyo (JP)

(73) Assignee: The Furukawa Electric Co., Ltd., Tokyo (JP)

(*) Notice: Subject to any disclaimer, the term of this patent is extended or adjusted under 35 U.S.C. 154(b) by 0 days.

(21) Appl. No.: 10/113,671

(22) Filed: Apr. 2, 2002

(65) Prior Publication Data
US 2002/0150133 A1 Oct. 17, 2002

Related U.S. Application Data

(63) Continuation-in-part of application No. 09/497,141, filed on Feb. 3, 2000, now abandoned.

(30) Foreign Application Priority Data

Feb. 4, 1999 (JP) ............................................. 11-027184
Apr. 2, 2001 (JP) ........................................ 2001-103394

(51) Int. Cl.[7] ................................................ H01S 3/04
(52) U.S. Cl. ............................................ 372/36; 372/34
(58) Field of Search ........................ 372/34, 36; 385/88, 385/92

(56) References Cited

U.S. PATENT DOCUMENTS

| | | | |
|---|---|---|---|
| 5,181,214 A | * | 1/1993 | Berger et al. .................. 372/34 |
| 5,542,018 A | * | 7/1996 | Kuhara et al. ................. 385/92 |
| 5,832,015 A | * | 11/1998 | Goto et al. ..................... 372/34 |
| 6,053,640 A | * | 4/2000 | Miyokawa et al. ............ 385/88 |
| 6,146,025 A | * | 11/2000 | Abbink et al. ................. 385/88 |

FOREIGN PATENT DOCUMENTS

| | | | | |
|---|---|---|---|---|
| JP | 07-221265 | * | 8/1995 | ........... H01L/25/07 |
| JP | 10-062659 | | 3/1998 | |
| JP | 10-300988 | | 11/1998 | |
| JP | 11-140559 | | 5/1999 | |

OTHER PUBLICATIONS

Ayers et al., "Review of the Thermal Conductivity of Graphite–Reinforced Metal Matrix Composites", Journal of Thermophysics and Heat Transfer, vol. 12, No. 1, pp. 10–16, Jan.–Mar. 1998.

Weeks et al., "Cooper–Graphite Composites for Thermal Management", 40th International SAMPE Symposium, pp. 1708–1717, May. 8–11, 1995.

* cited by examiner

*Primary Examiner*—Paul Ip
*Assistant Examiner*—Tuan Nguyen
(74) *Attorney, Agent, or Firm*—Lacasse & Associates, LLC

(57) ABSTRACT

A semiconductor laser module is packaged on a mounting substrate through a thermal diffusion sheet member. The thermal diffusion sheet member is that having thermal conductivity where thermal conductivity in the surface direction is greater than that in the thickness direction. Specifically, the thermal diffusion sheet member is graphite, for example, and has a thermal conductivity of 300 W/m·K or greater in the surface direction.

13 Claims, 9 Drawing Sheets

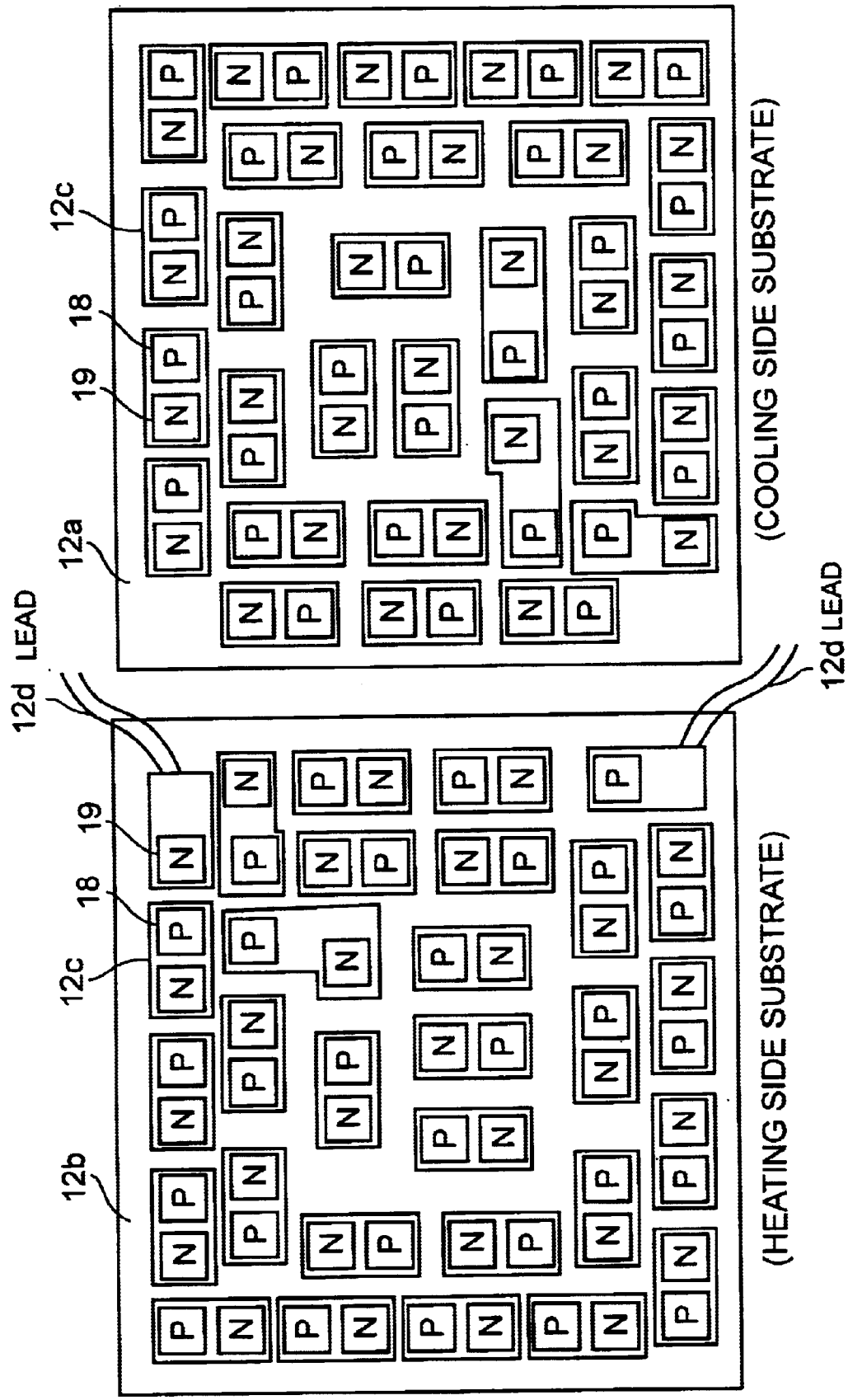
Fig. 2b (COOLING SIDE SUBSTRATE)
Fig. 2a (HEATING SIDE SUBSTRATE)

MOUNTING STRUCTURE FOR SEMICONDUCTOR LASER MODULE

CROSS-REFERENCE TO RELATED APPLICATION

The present application is a continuation-in-part application of U.S. patent application Ser. No. 09/497,141, filed Feb. 3, 2000 is now abandoned.

FIELD OF THE INVENTION

The present invention relates to a semiconductor laser module which is suitable for the use in particularly high temperature environments, and a Thermo-module (TEC: Thermo Electric Cooler) used in the semiconductor laser module.

BACKGROUND OF THE INVENTION

Recently, a great number of semiconductor lasers have been used as a light source for signals and a pumping light source for an optical fiber amplifier in optical transmissions. Where the semiconductor laser is used as signal light source and a pumping light source in optical transmissions, it is frequently used as a semiconductor laser module. The semiconductor laser module is a device in which a laser beam from a semiconductor laser is optically coupled to an optical fiber.

FIG. 6 shows one example of structures of such a semiconductor laser module. A semiconductor laser module 40 illustrated in FIG. 6 is such that in a package 11, Thermo-module 42 is fixed on the bottom 11a of a package. A substrate 16, on which a semiconductor laser element 13, a thermistor 14 and a lens 15 are fixed, is fixed on the Thermo-module 42. Also, an optical fiber 17 is fixed in a throughhole 11c secured at a sidewall 11b of the package 11. In FIG. 6, 50 indicates a heat sink.

The semiconductor laser module 40 has a function by which a laser beam emitted from the semiconductor laser element 13 is condensed by using the lens 15 and is made incident into the end face of the optical fiber 17. Subsequently, the laser beam is propagated in the optical fiber 17 and is provided for a specified usage.

In the semiconductor laser module 40, an electric current is fed to drive the semiconductor laser element 13, whereby the temperature of the semiconductor laser element 13 is increased by the generation of heat. The temperature rise will become a cause from which changes in the oscillation wavelength and optical output of the semiconductor laser element 13 results.

Therefore, a thermistor 14 is fixed in the vicinity of the semiconductor laser element 13, which measures the temperature of the semiconductor laser element 13. Using a value measured by the thermistor 14, the electric current fed into a Thermo-module 42 is controlled, whereby the temperature of the semiconductor laser element 13 is kept at a required value by the current control, and the characteristics of the semiconductor laser element 13 are stabilized.

The Thermo-module 42 used in the semiconductor laser module 40 has, generally as shown in FIG. 7A, P type thermoelectric converting elements 18 being a P type semiconductor and N type thermoelectric converting elements 19 being an N type semiconductor 19. The P type thermoelectric converting elements 18 and N type thermoelectric converting elements 19 are disposed alternatively in a row, and are arranged between two insulation layers 12a and 12b, for example, consisting of ceramic. The P type thermoelectric converting elements 18 and N type thermoelectric converting elements 19 are electrically connected to each other in series. By application of a direct current voltage to the P type thermoelectric converting elements 18 and N type thermoelectric converting elements 19, heat is conveyed to or absorbed on the surfaces of the insulation layers 12a and 12b, whereby an object is heated or cooled.

FIG. 7A shows a cross section of the Thermo-module 42. The Thermo-module 42 is such that P type thermoelectric converting elements 18 and N type thermoelectric converting elements 19 are placed between two ceramic-made insulation substrates 12a and 12b made of alumina or aluminum nitride. These thermoelectric effect elements 18 and 19 are electrically connected to each other by electrodes 12 formed on the surface of the insulation substrates 12a and 12b.

FIG. 7B is a perspective view of a Thermo-module 42 illustrated with the insulation substrates 12a and 12b omitted. The Thermo-module 42 is formed so that a number of thermoelectric converting elements 18 and 19 are two dimensionally uniformly disposed on the insulation substrates 12a and 12b.

FIG. 7C shows an electric connection of the respective thermoelectric effect elements 18 and 19, wherein the P type thermoelectric converting elements 18 and N type thermoelectric converting elements 19 are alternatively connected in series.

The number of thermoelectric elements 18 and 19 to be connected changes in compliance with application. Such that, for example, the number of pairs of the p type thermoelectric converting elements 18 and N type thermoelectric converting elements 19 being from 20 through 40 may be used in a semiconductor laser module.

Such a Thermo-module 42 may be produced as shown below. First, an ingot is produced of material powder mainly consisting of bismuth (Bi) and tellurium (Te) by a single crystallizing method or a hot-pressing method. And, the ingot is cut like chips to produce the P type thermoelectric converting elements 18 and N-type thermoelectric converting elements 19. (For example, this is a publicly known technology disclosed by Japanese Laid-Open Patent Publication Nos. 202343 of 1989 and 106478 of 1989).

Next, as shown in FIG. 8A, a plurality of electrodes 12c are installed on the insulation substrate 12a, and at the same time soldering paste 12e is coated on the respective electrodes 12c. Next, as shown in FIG. 8B, the chip-like P type thermoelectric converting elements 18 are placed one by one on the respective electrodes 12c. Thereafter, as shown in FIG. 8C, the above chip-like N type thermoelectric converting elements 19 are placed one by one on the respective electrodes 12c, whereby the P type thermoelectric converting elements 18 and N type thermoelectric converting elements 19 are disposed alternatively.

And, as in FIG. 8A above, a plurality of electrodes 12c are installed in the insulation substrate 12b, and at the same time, soldering paste 12e is coated on the respective electrodes 12c. And, as shown in FIG. 8D, the insulation substrate 12b having the electrodes 12c provided are arranged on the insulation substrate 12a on which the P type thermoelectric converting elements 18 and N type thermoelectric converting elements 19 are placed. The arrangement is carried out so that the electrodes 12c secured on the insulation substrates 12b are bridged on the electrodes 12c secured on the insulation substrates 12a. That is, adjacent electrodes 12c on the upper insulation substrate 12b are, respectively, put on the P type thermoelectric converting elements 18 and N type thermoelectric converting elements 19 on the electrodes 12c of the lower insulation substrates 12a.

In this state, soldering paste 12e is reflown in a soldering reflow furnace (not illustrated). By reflow, the P type thermoelectric converting elements 18 and N type thermoelectric converting elements 19 are bonded between two insulation substrates 12a and 12b, and at the same time, the P type thermoelectric converting elements 18 are electrically connected to the N type thermoelectric converting elements 19 in series via electrodes 12c. And, a Thermo-module 42 shown in FIG. 8E can be produced by the above production process.

The reason why heating and cooling actions can be produced by feeding an electric current to a Thermo-module are described below. That is, as described above, the P type thermoelectric converting elements 18 and N type thermoelectric converting elements 19 are placed between two insulation substrates 12a and 12b, and are electrically connected to each other in series. Therefore, as shown in FIG. 7A, by application of a direct current voltage from outside the Thermo-module 42, an electric current flows from the insulation substrate 12a toward the insulation substrate 12b in the P type thermoelectric converting elements 18, and flows from 12b toward 12a in the N type thermoelectric converting elements 19.

However, holes are majority carriers in the p type thermoelectric converting elements 18, and electrons are majority carriers in the N type thermoelectric converting elements 19. Respectively, transfer of particles carrying the electric current occurs in a direction from the insulation substrate 12a through the insulation substrate 12b. On the other hand, the holes and electrons carrying the electric current also carry heat. Therefore, a heat flow constantly occurs in one direction while the electric current flows in directions opposite to each other in the p type thermoelectric converting elements 18 and N type thermoelectric converting elements 19. Accordingly, cooling is carried out at one side of the Thermo-module 42 and heating is carried out at the other side thereof.

A semiconductor laser module 40 shown in FIG. 6 has such a Thermo-module 42 as described above. A description is given of a thermal environment where the semiconductor laser module 40 is in operation.

In a case where the semiconductor laser module 40 is incorporated in a transmission device such as an optical fiber amplifier, etc., there are many cases where semiconductor laser modules are used at a higher temperature environment than room temperature, due to heating of other semiconductor laser modules and electric circuit elements, etc., which are simultaneously incorporated therein, and specified environments where the transmission device is installed. Therefore, the semiconductor laser module 40 is usefully fixed on a heat sink 50 to be used with an efficient heat dissipation.

FIG. 9 is an exemplary view showing a thermal environment where the semiconductor laser module 40 is fixed at the heat sink 50 and used thereat. Further, in the same drawing, a lens 15 and an optical fiber 17 are omitted for the sake of description.

As shown in FIG. 9, it is assumed that the temperature of an environment where the semiconductor laser module 40 is placed is Ta, and the temperature of the heat sink 50 is Ths. Herein, an electric current is supplied to the semiconductor laser element 13 while keeping the temperature Ts of the thermistor 14 constant. In this case, the amount of heat QLD generated by the semiconductor laser element 13 is transmitted through the substrate 16 and reaches the insulation substrate 12a at the cooling side of the Thermo-module 42, and is exhausted to the insulation substrate 12b at the heating side.

Simultaneously, the amount of heat QTM generated in the Thermo-module 42 itself by the current flowing therein is exhausted to the insulation substrate 12b. Subsequently, the amount of heat (QLD+QTM) is exhausted to the heat sink 50 via the base plate 11a of a package 11.

Where the temperatures of the insulation substrate 12a at the cooling side of the Thermo-module 42 and of the insulation substrate 12b at the heating side thereof are, respectively, TC and Th, the thermal impedance between the semiconductor laser element 13 and the insulation substrate 12a at the cooling side is K1, and the thermal impedance between the insulation substrate 12b at the heating side and the heat sink 50 is K2, the following expressions can be established.

$$Th = Ths + K2(QLD + QTM) \quad (1)$$

$$Tc = Ts - K1 QLD \quad (2)$$

Therefore, ΔT=Th−Tc, which is a temperature difference between the insulation substrates 12a and 12b of the Thermo-module 42 can be expressed by expression (3) below:

$$\Delta T = (Ths - Ts) + (K1 + K2)QLD + K2 QTM \quad (3)$$

In the expression (3), (Ths−Ts) which is the first term of the right side indicates a temperature difference between inside and outside of the semiconductor laser module 40 where the Thermo-module is used therein.

That is, since there exists a thermal impedance K2 between the insulation substrate 12b at the heating side and the heat sink 50 by the above expression (1), the temperature Th of the heating side substrate 12b of the Thermo-module 42 becomes higher by K2(QLD+QTM) than the temperature Ths of the heat sink.

Further, since there exists a impedance K1 between the semiconductor laser element 13 and the insulation substrate 12a at the cooling side by the expression (2), the temperature Tc the insulation substrate 12a at the cooling side becomes lower by K1 QLD than the thermistor temperature Ts (temperature of the semiconductor laser element).

Thereby, where the Thermo-module is used in a semiconductor laser module 40, a temperature difference (Ths−Ts) between the inside and outside of the semiconductor laser module is decreased by (K1+K2) QLD+K2 QTM in comparison with the temperature difference ΔT between the insulation substrates of the Thermo-module 42.

Objects and Summary of the Invention

Recently, demand has grown for the abovementioned semiconductor laser modules to operate, at higher optical output and at a higher environmental temperature, in line with an increase in output of the entire system.

As a semiconductor laser element is devised to match a high output in line with an increase in output of the semiconductor laser module, the heat generation amount (QLD) is necessarily increased. In order for such a high output semiconductor laser module to be used at a high temperature environment, it is necessary to further efficiently exhaust heat generating from the semiconductor laser elements than previously.

However, in the abovementioned semiconductor laser modules, there are the following problems.

A description is based on a semiconductor laser module 40 shown in FIG. 9. Amount of heat QLD generated from the semiconductor laser element 13 is exhausted to the heat sink 50 via a substrate 16, a Thermo-module 42, and a package base plate 11a.

Herein, since the entire thickness of the semiconductor laser module 40 is designed to be thin to a predetermined thickness due to being mounted in a device, the substrate 16 and package base plate 11a are also designed to be thin. Therefore, while heat QLD generated from the semiconductor laser element 13 is being transmitted through the substrate 16 in its thickness direction, and while the heat passes through the package base plate 11a and is exhausted to the heat sink 50, the above heat QLD does not sufficiently spread in the lateral direction (in a direction parallel to the plane of the insulation substrates 12a or 12b of the Thermo-module).

Also, a transfer of heat by the Thermo-module 42 does not principally spread in the lateral direction since the transfer is carried out via holes and electrons inside thermoelectric converting elements.

That is, the heat QLD generated from the semiconductor laser element 13 is concentrated directly below the semiconductor laser elements and in the vicinity thereof, flows and is exhausted to the outsides. Therefore, effective thermal impedance of a channel of the exhausted heat is made greater in comparison with a case where it is assumed that heat is sufficiently spread and uniformly dissipated.

This indicates that the effective values of K1 and K2 are significant in expressions (1) through (3). Where a semiconductor laser module is used in such a situation where the effective thermal impedance of the exhausted heat is significant, a temperature difference generated due to the thermal impedance is made greater in comparison with a case where the heat is uniformly dissipated.

And, the temperature difference is made remarkable in line with an increase in the heat QLD generated from the semiconductor laser element 13 and with an increase in the temperature of the environment where the semiconductor laser module 40 is used (that is, where the QTM is significant).

As a semiconductor laser module 40 is used in such a situation, the temperature difference $\Delta T$ between the insulation substrates 12a and 12b at the heating side and cooling side of the Thermo-module 42 is made very large. And, the load on the Thermo-module 42 is increased, power consumption is also increased, whereby this further increases the environmental temperature, resulting in a vicious cycle.

Therefore, in order to highly increase the output of the semiconductor laser module and to use the same under a further higher ambient temperature, it is necessary to make uniform the heat flow from the semiconductor laser element 13 to the heat sink 50. Accordingly, spreading of heat in the lateral direction is attempted by increasing the thickness of components existing in a channel of heat exhaust, such as a substrate 16, a package base plate 11a, etc. However, since the thickness of the components described above is limited by conditions of mounting a semiconductor laser module in a device, such a measure cannot be employed in reality.

The present invention was developed to solve a problem of heat exhaust existing in the prior art semiconductor laser module described above and to enable the use of the semiconductor laser module at a higher optical output and in a further higher temperature environment. More specifically, the invention is to provide a mounting structure for a semiconductor laser module comprising the semiconductor laser module fixed on amounting substrate. The semiconductor laser module in the mounting structure in one view comprises a package, wherein the package houses a semiconductor laser chip, a chip mounting substrate mounted with the semiconductor laser chip and a Thermo-module for cooling the chip mounting substrate inside thereof; the Thermo-module is placed and fixed on the bottom wall of the package and supports the chip mounting substrate; and a thermal diffusion sheet member is laid between the bottom surface of the package and the surface of the mounting structure, having thermal conductivity anisotropy where thermal conductivity is higher in the surface direction than in the thickness direction.

Additionally, the invention is to provide a mounting structure for a semiconductor laser module in another view, the semiconductor laser module in the mounting structure comprises a package, wherein the package houses a semiconductor laser chip and a chip mounting substrate mounted with the semiconductor laser chip inside thereof; the chip mounting substrate mounted with the semiconductor laser chip is supported by the bottom wall of the package; and a thermal diffusion sheet member is laid between the bottom surface of the package and the surface of the mounting structure, having thermal conductivity anisotropy where thermal conductivity is higher in the surface direction than in the thickness direction.

BRIEF DESCRIPTION OF THE DRAWINGS

These and other objects and advantages of the present invention will become more apparent and more readily appreciated from the following detailed description of the exemplary embodiments of the invention taken in conjunction with the accompanying drawings, in which:

FIG. 2A is a view showing an arrangement and a wiring pattern of a thermoelectric effect element of a Thermo-module used in a semiconductor laser module according to the preferred embodiment of the invention, in which the heating side substrate is observed from the cooling side substrate, and FIG. 2B is a view showing an arrangement and a wiring pattern of a thermoelectric effect element of a Thermo-module used in a semiconductor laser module according to the preferred embodiment of the invention, in which the cooling side substrate is observed from the heating side substrate;

DETAILED DESCRIPTION OF THE PREFERRED EMBODIMENTS

Figure 1:
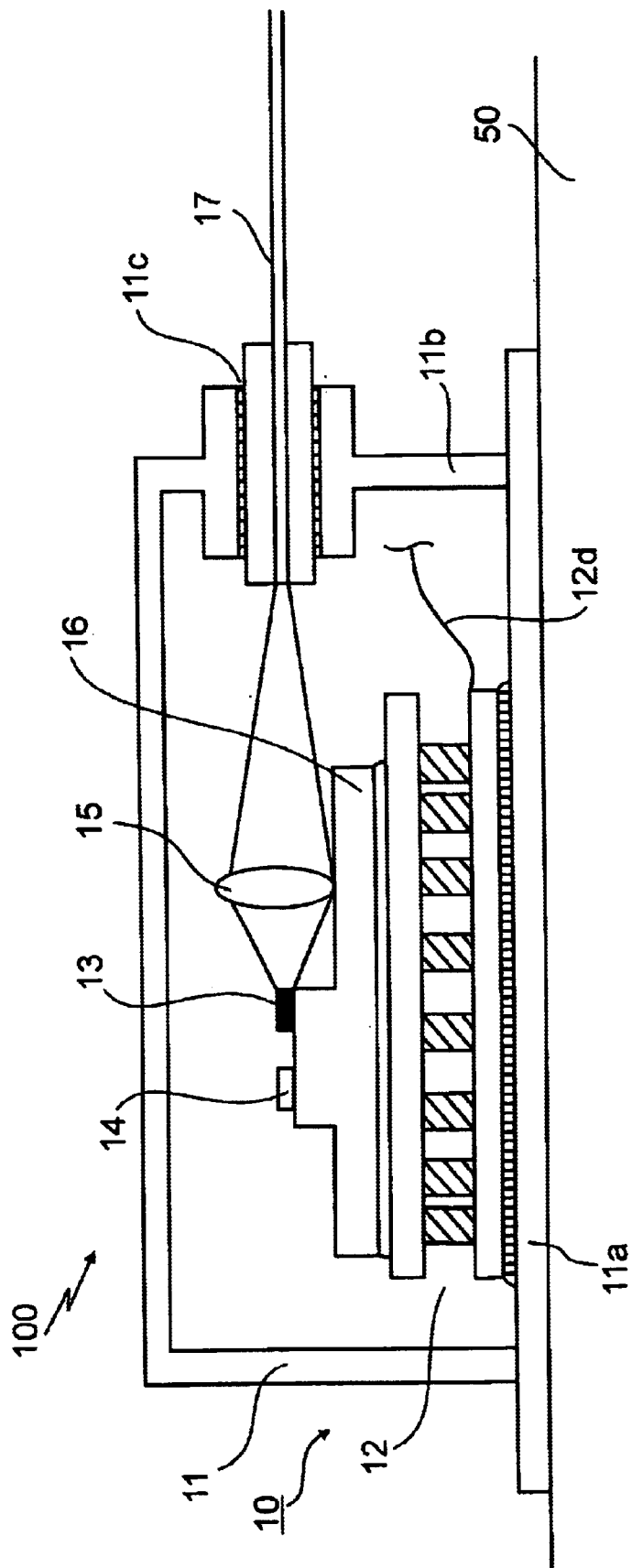
FIG. 1 is a cross-sectional view of a semiconductor laser module according to a preferred embodiment of the invention.

Hereinafter, a description is given of preferred embodiments of the invention with reference to the accompanying. That is, in the description of the preferred embodiments, parts, which are identical to those of the prior art example, are given the same reference numerals, and overlapping description thereof is omitted.

FIG. 1 shows one example to which a preferred embodiment of a semiconductor laser module according to the invention applies.

As shown in FIG. 1, a semiconductor laser module 10 according to the invention has a semiconductor laser element 13. The semiconductor laser element 13 is fixed on a substrate 16. Also, although not illustrated, the semiconductor laser element 13 may be fixed on the substrate 16 via a heat sink made of aluminum nitride (AlN), etc., and the substrate 16 is soldered and fixed on a Thermo-module 12 which is also soldered and fixed on the base plate 11a of a package 11. By fixing the substrate 16 onto the Thermo-module 12, the semiconductor laser element 13 is disposed upward at roughly the central part of the Thermo-module 12.

An optical fiber 17 is fixed in a throughhole 11c of the sidewall 11b of the package 11. The optical fiber 17 is fixed at a position to which light condensed by a lens fixed on the substrate 16 and emitting from the semiconductor laser element 13 is coupled.

Also, on the substrate 16, a thermistor 14 is fixed in the vicinity of the semiconductor laser element 13. In the semiconductor laser module 10, a heat exhaust channel which exhausts heat emitting from the semiconductor laser element 13 is formed so as to include a substrate 16, a Thermo-module 12, and the base plate 11a of a package 11.

Herein, a Thermo-module 12 used in a semiconductor laser module according to the invention has a larger heat absorbing amount at the periphery than the heat absorbing amount at roughly the central part just under the semiconductor laser element 13. FIG. 2A shows one example of an arrangement and electrode patterns of a thermoelectric converting element on the heating side substrate 12b of the Thermo-module 12, and FIG. 2B shows one example of an arrangement and electrode patterns of a thermoelectric converting element on the cooling side substrate 12a of the Thermo-module 12.

Further, FIG. 2A is a view in which the heating side substrate 12b is observed from the cooling side substrate 12a, and FIG. 2B is a view in which the cooling side substrate 12a is observed from the heating side substrate 12b.

In FIGS. 2A and 2B, P type thermoelectric converting elements 18 and N type thermoelectric converting elements 19 are arrayed to have greater density toward the surrounding parts and to be thinner at roughly the central part. These are connected in series by electrodes 12c. Herein, since the electric currents flowing in the respective thermoelectric converting elements 1e and 19 are all the same, amount of heat which the thermoelectric converting elements 18 and 19 convey from the cooling side substrate 12a to the heating side substrate 12b are all equal in the respective P type and N type thermoelectric converting elements 18 and 19. Therefore, the Thermo-module 12 becomes a Thermo-module in which the heat absorbing amount becomes larger toward the surrounding part where the thermoelectric converting elements 18 and 19 are densely arrayed, and the heat absorbing amount becomes smaller at roughly the central part.

In addition, such a Thermo-module 12 can be produced by the same method for producing commonly known Thermo-modules, excepting changes in the position for forming electrode patterns on the insulation substrates 12a and 12b and arrangement of thermoelectric converting elements.

Figures 3A, 3B:
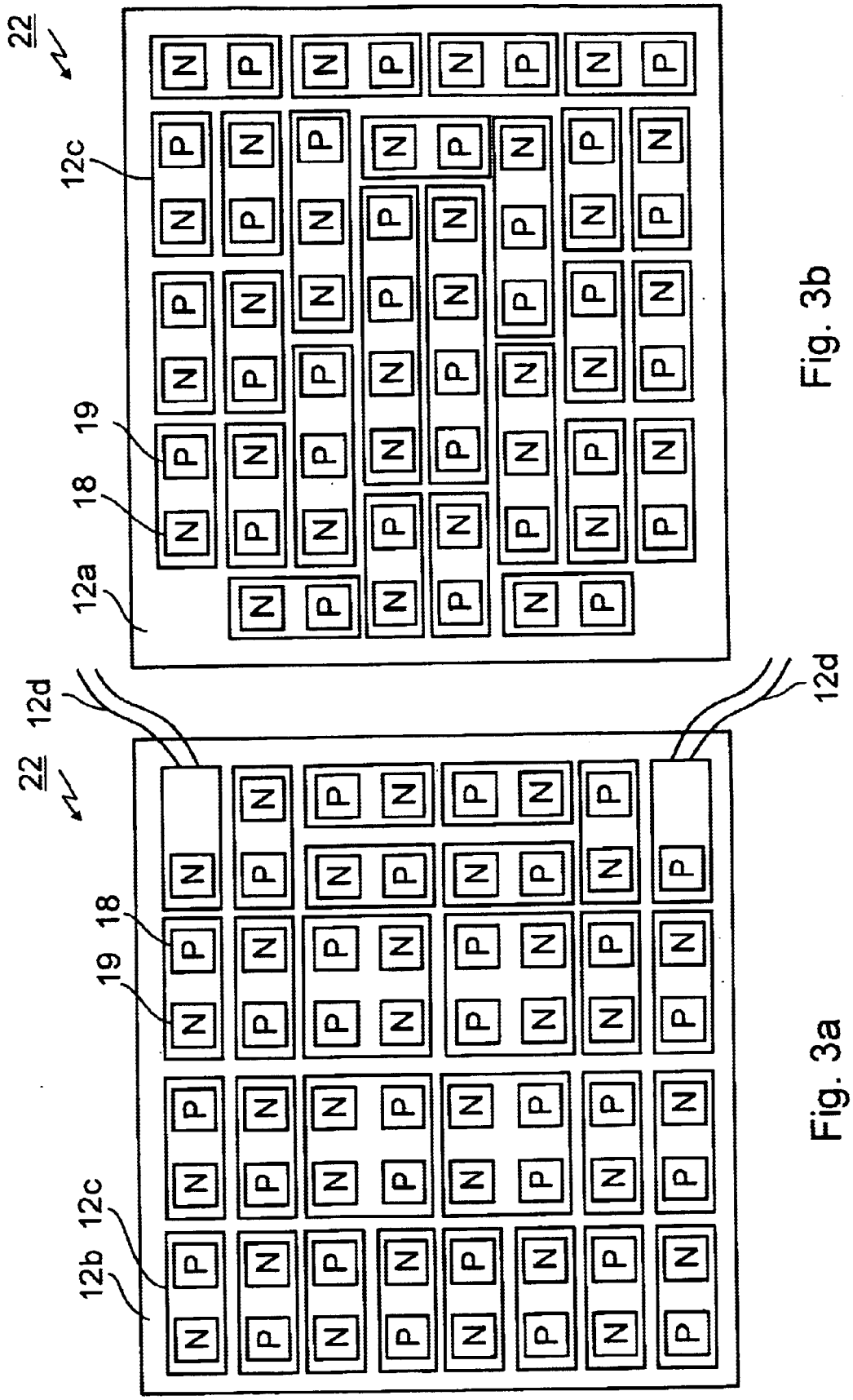
FIG. 3A is a view showing an arrangement and a wiring pattern of a thermoelectric effect element of a Thermo-module used in a semiconductor laser module according to another preferred embodiment of the invention, in which the heating side substrate is observed from the cooling side substrate.
FIG. 3B is a view showing an arrangement and a wiring pattern of a thermoelectric effect element of a Thermo-module used in a semiconductor laser module according to the preferred embodiment of the invention, in which the cooling side substrate is observed from the heating side substrate.

Also, FIG. 3A shows another example of arrangements of the thermoelectric converting elements 18 and 19 on the heating side substrate 12b of a Thermo-module 22 used in a semiconductor laser module according to the invention, and patterns of electrodes thereof. FIG. 3B is another example of arrangements of the thermoelectric converting elements 18 and 19 on the cooling side substrate 12a of the Thermo-module 22, and patterns of electrodes thereof. Also, FIG. 3A is a view in which the heating side substrate 12b is observed from the cooling side substrate 12a, and FIG. 3B is a view in which the cooling side substrate 12a is observed from the heating side substrate 12b.

Figure 4:
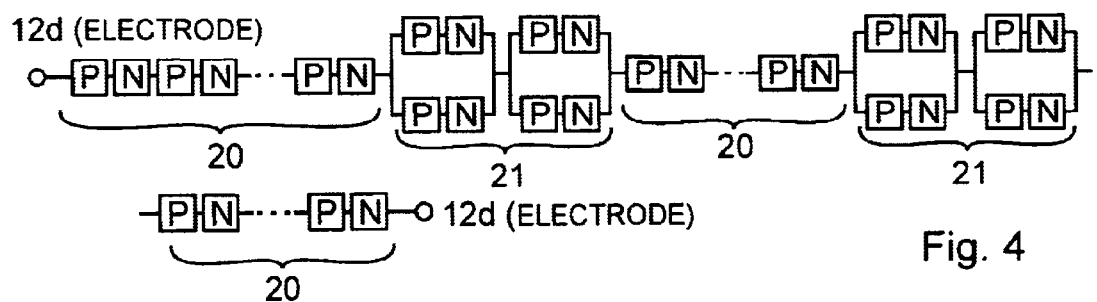
FIG. 4 is a wiring diagram of a thermoelectric effect element of a Thermo-module used in a semiconductor laser module according to another preferred embodiment of the invention.

Further, FIG. 4 is a view showing an electric diagram of the respective thermoelectric converting elements 18 and 19 of the Thermo-module shown in FIGS. 3A and 3B. In the present preferred embodiment, the thermoelectric converting elements are disposed to be two-dimensionally uniform. Electrical connections of the thermoelectric converting elements 18 and 19 provide the first portion 20 in which the P type thermoelectric converting elements 18 and N type thermoelectric converting elements 19 are connected in series, and the second portion 21 in which these are connected in parallel as shown in FIG. 4, wherein the first portion 20 is disposed at the surrounding part, and the second portion 21 is disposed at a roughly central part.

In such a Thermo-module 22, an electric current flowing in one thermoelectric converting element in the second portion 21 is made smaller in comparison with an electric current flowing in one thermoelectric converting element in the first portion 20. Therefore, the amount of heat which one thermoelectric converting element in the second portion 21 conveys is made smaller than that which one thermoelectric converting element conveys in the first portion 20. Accordingly, in the Thermo-module 22, the heat absorbing amount is made smaller at roughly the central part and is made larger at the surrounding part since the thermoelectric converting elements 18 and 19 in the first portion 20 are disposed at the surrounding part while those in the second portion 21 are disposed at roughly the central part.

In a case where a Thermo-module 12 (or Thermo-module 22), in which the heat absorbing amount shown in FIGS. 2A and 2B (or FIGS. 3A an 3B) is smaller at roughly the central part and is larger at the surrounding part, is used in a semiconductor laser module 10, it is preferable that the semiconductor laser element 13 is disposed at roughly the central part of the Thermo-module 12 (or Thermo-module 22).

That is, in FIGS. 2A, 2B, 3A and 3B, the Thermo-module 12 (or Thermo-module 22) is formed so that the heat absorbing amount is made larger toward the surrounding part in comparison with the heat absorbing amount at roughly the central part where the semiconductor laser element 13 is fixed. Therefore, in these constructions, in comparison with a case where a prior art Thermo-module 42 is used, a temperature distribution on a substrate 16 where, a semiconductor laser element 13 is fixed is made further lower at the surrounding part of the semiconductor laser element 13.

Accordingly, a heat transfer can effectively occur on the substrate 16 by the temperature gradient toward the surrounding part from roughly the central part where the semiconductor laser element 13 is fixed. Resultantly, a flow of heat exhausted can be spread to the surrounding part, whereby actual impedance of the heat exhaust channel can be made smaller. And, a temperature difference between the heating side substrate 12b and the cooling side substrate 12a of a Thermo-module 12 (or Thermo-module 22) is reduced to relieve the load on the Thermo-module. As a result, the semiconductor laser module 10 becomes a semiconductor laser module capable of operating at a further higher temperature with less power consumption.

Further, a Thermo-module used in a semiconductor laser module 10 according to the invention is not limited to a type of Thermo-module 12 or Thermo-module 22 as illustrated in FIGS. 2A and 2B or FIGS. 3A and 3B. That is, it is needless to say that a Thermo-module used in a semiconductor laser module 10 can bring about the abovementioned actions if the heat absorbing amount thereof is smaller at roughly the central part and larger at the surrounding part.

For example, it is also needless to say that a wiring method of thermoelectric converting elements 18 and 19 shown in FIG. 4 can be such that serial or parallel connections may be combined in various patterns.

Further, in the present invention, by constructing as described below a substrate 16 on which the semiconductor laser element 13 is fixed, it becomes possible to spread heat emitting from a semiconductor laser element 13 in lateral directions, whereby effects similar to or equal effects can be obtained. That is, the to the abovementioned substrate 16 is formed of, for example, a material having anisotropy in thermal conductivity, in which the thermal conductivity in a plane parallel to the cooling plane of a Thermo-module is larger than the thermal conductivity in the direction vertical to the cooling plane of the Thermo-module (that is, the thermal conductivity in the direction vertical to a direction from the semiconductor laser element toward the Thermo-module is larger than that in the latter direction), whereby effects similar to or equal to the abovementioned effects can be obtained.

As a material of the substrate 16 having such anisotropy in thermal conductivity, fiber reinforced composites in which metal is used as a matrix may be used. As such composites, those in which, for example, carbon (C), alumina ($Al_2O_3$), silicon carbide (SiC), etc., are used as a dispersant, while copper (Cu), molybdenum (Mo), tungsten (W), Aluminum (Al), titanium (Ti), etc., are used as a matrix, are commonly known.

For example, the following may be available as a method for producing composites in which carbon fibers are used as a dispersant while Copper or copper alloy is used as a matrix. That is, first, copper powder, copper alloy powder, molybdenum powder, tungsten-powder, or powder of these mixtures is blended by a method such as a ball mill, etc., along with carbon and/or graphite fibers. And, the material mixture is pressed to obtain a compression-molded substance of the mixture. Further, the compression-molded substance is compressed in one axis direction by hot isostatic pressing. In composites produced as described above, fibers made of carbon and/or graphite are oriented at random in a two-dimensional direction vertical to the compression direction in the metal matrix. Also, such composites and its producing method thereof are disclosed in, for example, Japanese Laid-Open Patent Publication No.140559 of 1999.

Using the abovementioned complex material, the upper and lower sides of the substrate 16 are formed so as to be parallel to the plane of orientation of the carbon fibers, whereby a substrate having anisotropy in thermal conductivity is obtained, in which the thermal conductivity in a plane parallel to the Thermo-module 12 is larger than that in the direction vertical to the cooling plane of the Thermo-module 12. In addition, it is not necessary that the entirety of the substrate 16 is made of the abovementioned composites. That is, sufficiently effective results can be obtained by only forming a part thereof of the abovementioned complex material.

In a case where the entire substrate 16 is made of composites, the thermal conductivity in a plane parallel to the cooling plane of the Thermo-module 12 and that in the direction vertical to the plane becomes, for example, approx. 250 W/mK, 100 W/mK, respectively. Further, the direction of orientation of fibers may not be made two-dimensional, but may be made one-dimensional. In this case, a further larger anisotropy in thermal conductivity can be obtained.

In addition, a carbon material having an anisotropy in thermal conductivity, which is sold by, for example, ADVANTEST CERAMIC Corp. (the United States of America), may be utilized as the thermal conductivity anisotropical material. As such a carbon material, the maximum thermal conductivity of 1700 W/mK or so is available. By coating a metal onto such a carbon material, or coating SiC/Al (thermal expansion ratio: 6.7 ppm/C) whose thermal expansion ratio is near to that of alumina, aluminum nitride, etc., being an insulation substrate of a Thermo-module 12, such materials may be preferably applicable to the invention.

And, by employing a substrate 16 having the abovementioned anisotropy in thermal conductivity, heat emitting from the semiconductor laser element 13 can spread very efficiently in a direction parallel to the cooling plane of the Thermo-module 12, whereby the actual impedance of exhausted heat is reduced. As a result, the load on the Thermo-module 12 is relieved, whereby a semiconductor laser module capable of operating at a higher temperature environment with less power consumption can be obtained. Still further, if a substrate 16 made of a material having such anisotropy in thermal conductivity is simultaneously used along with a Thermo-module 12 in which the heat absorbing amount is smaller at roughly the central part and is larger at the surrounding part, effects of the present invention can become further remarkable.

Also, in addition to the substrate 16 having a semiconductor laser element 13 fixed thereon, the base plate 11a of a package 11 may be made of a material having such anisotropy in thermal conductivity as described above. And, if a base plate is made so that the thermal conductivity in a plane parallel to the heating plane of the Thermo-module 12 becomes larger than the thermal conductivity in the direction vertical to the heating plane of the Thermo-module 12, effects of the present invention can become further remarkable.

Still further, where the base plate 11a is formed, as a material having the abovementioned anisotropy in thermal conductivity, of fiber-reinforced composites such as Cu—C, etc., with copper or copper alloy matrix and carbon dispersant, the hermeticity of a package 11 may not be obtained, because such fiber-reinforced composites as described above has minute pores resulting from holes formed in compliance with the state of orientation of a dispersant and has ventilation properties.

Figure 5A:
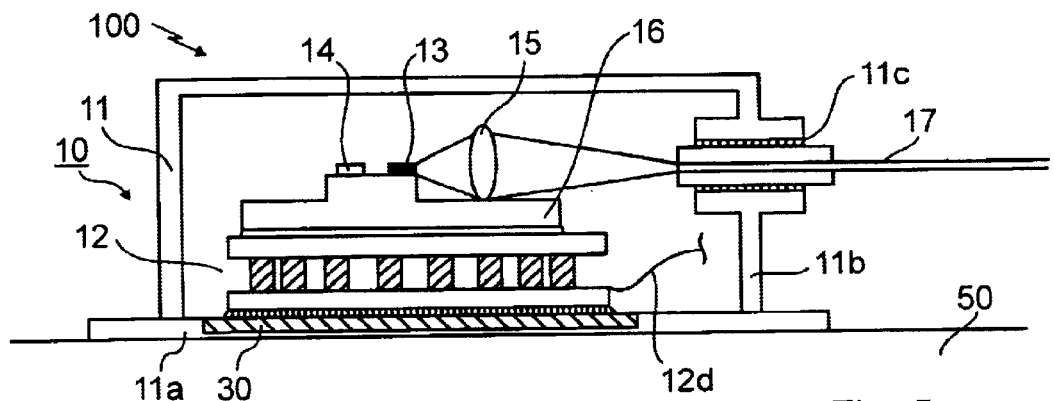
FIGS. 5A and 5B are views showing a structure for fixing a Thermo-module used in a semiconductor laser module, according to another preferred embodiment of the invention, to the base plate.
Figure 5B:
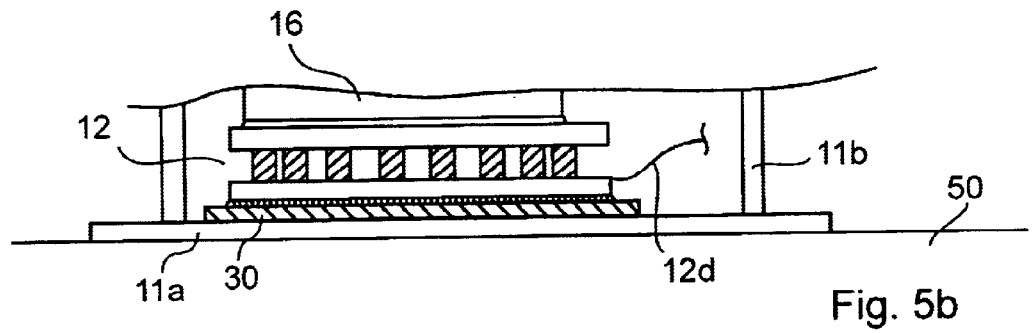
Figure 6:
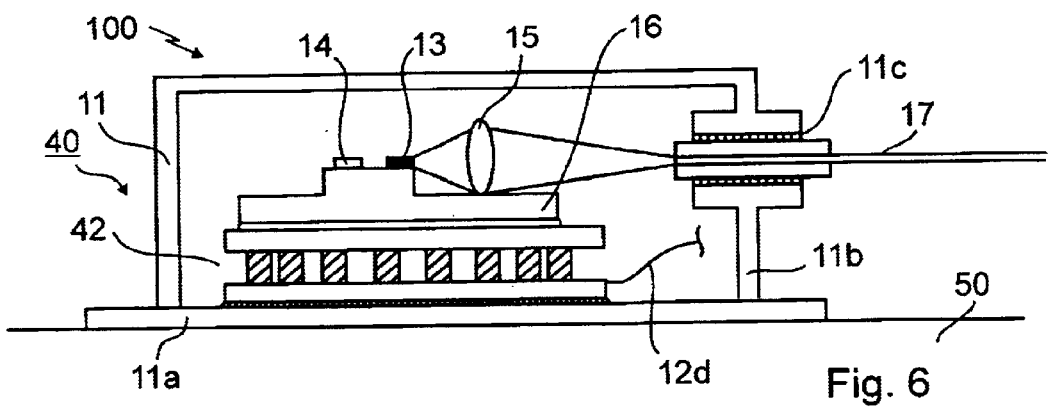
FIG. 6 is a cross-sectional view of a prior art semiconductor laser module.
Figure 7A:
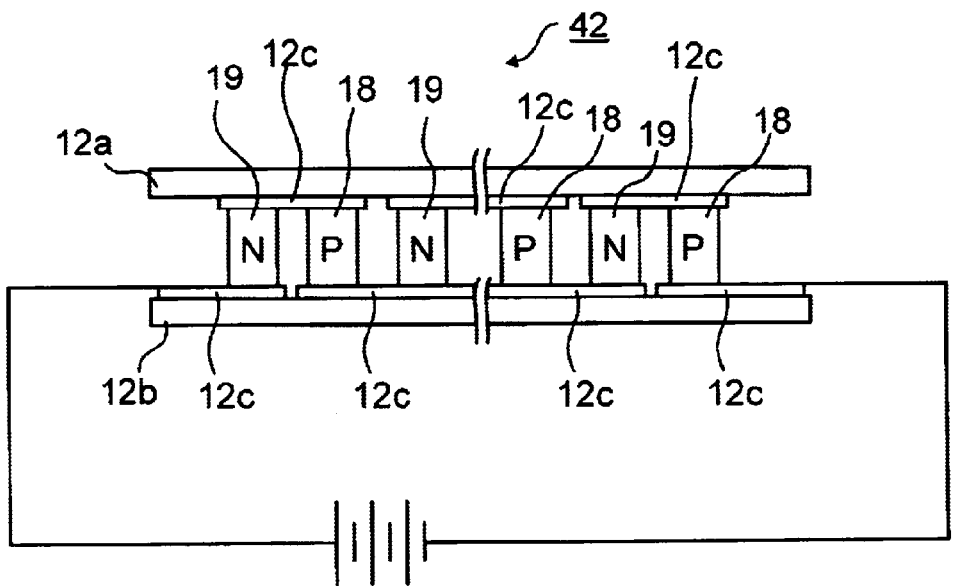
FIG. 7A is a cross-sectional view of a Thermo-module used in the prior art semiconductor laser module.
Figure 7B:
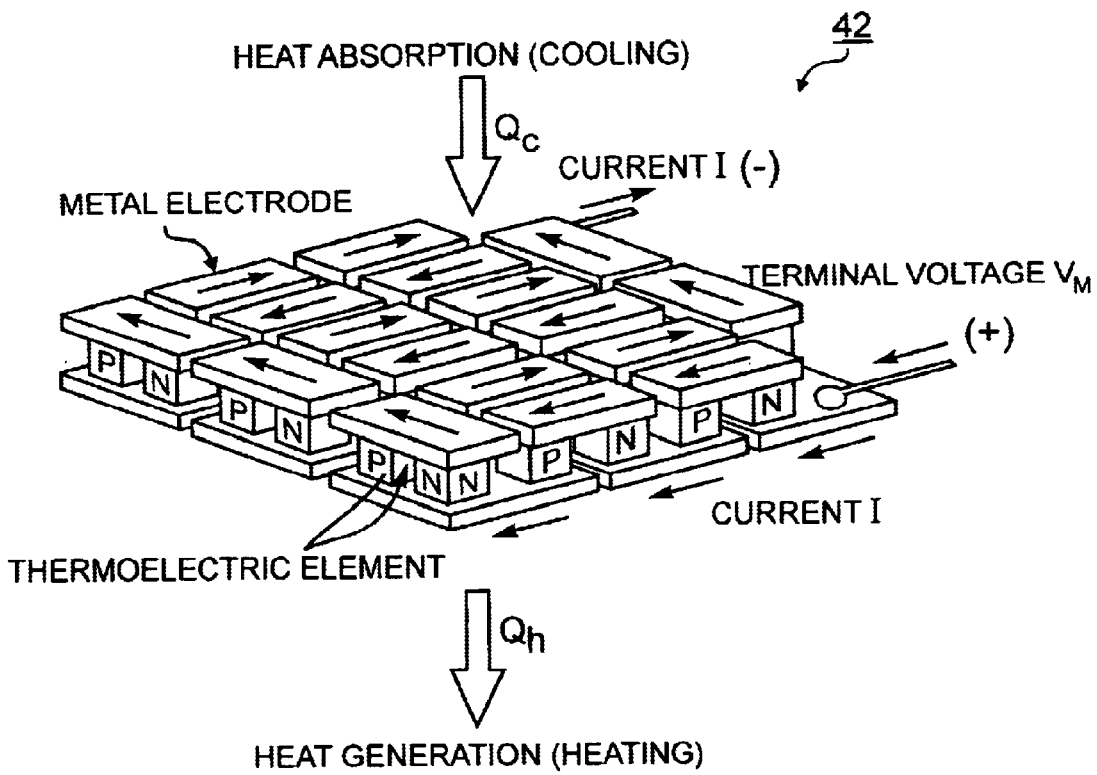
FIG. 7B is a perspective view depicting a Thermo-module used in the prior art semiconductor laser module with its upper and lower insulation substrates omitted.
Figure 7C:
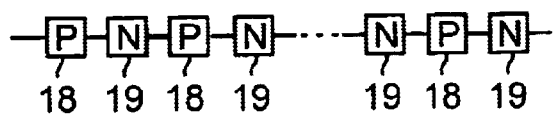
FIG. 7C is a wiring diagram of a thermoelectric effect element of a Thermo-module used in the prior art laser module.
Figure 8A:
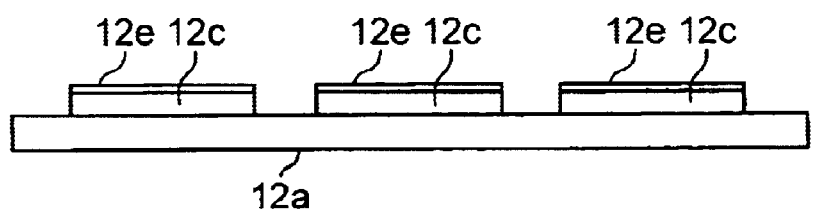
FIGS. 8A, 8B, 8C, 8D, and 8E are explanatory views showing a method for producing a Thermo-module.
Figure 8B:
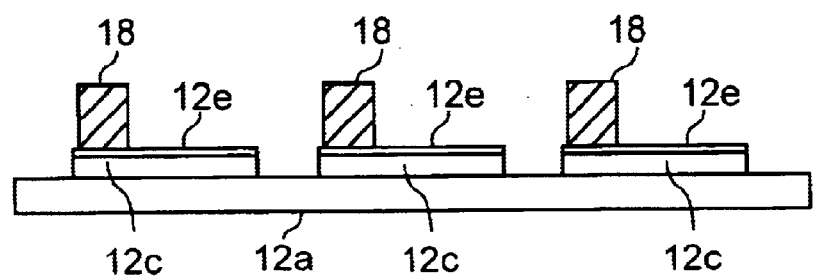
Figure 8C:
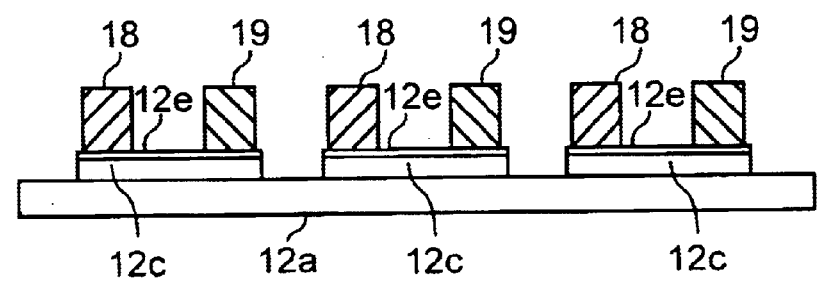
Figure 8D:
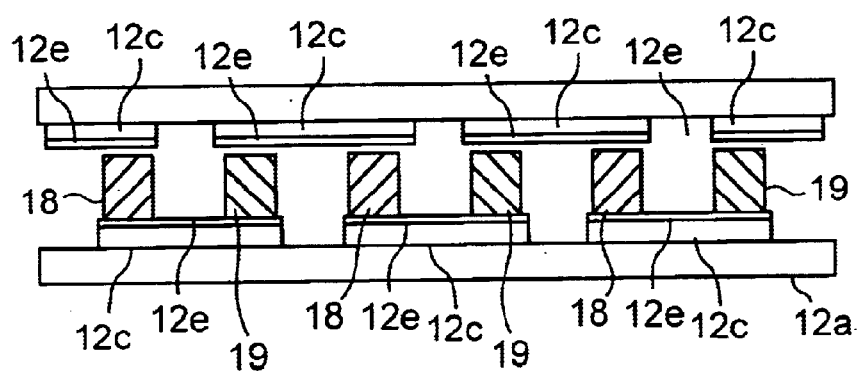
Figure 8E:
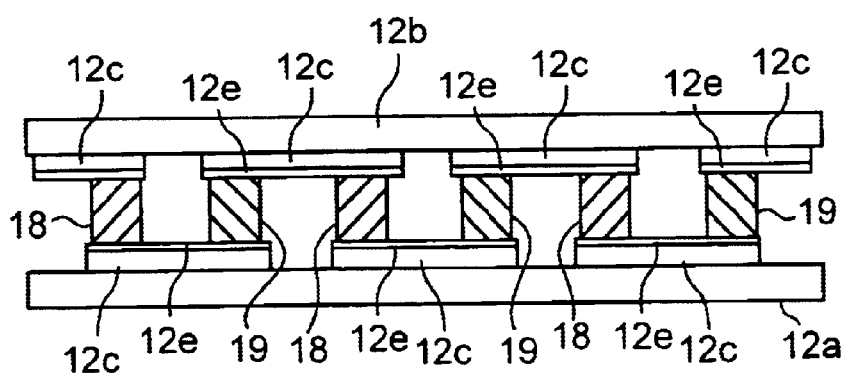
Figure 9:
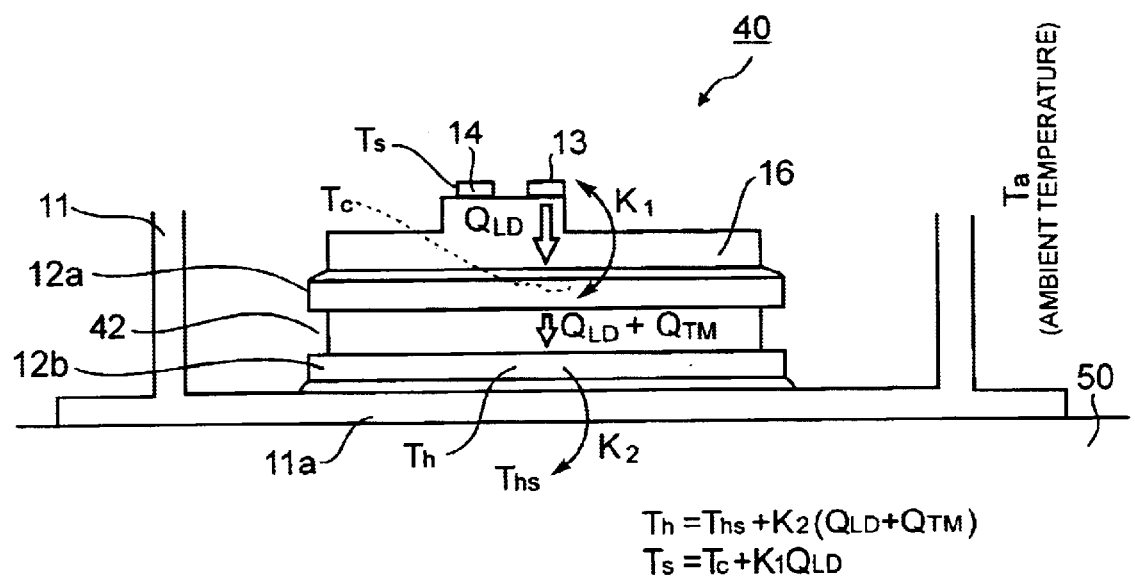
FIG. 9 is a explanatory views showing a thermal environment of a semiconductor laser module.

Therefore, for example, as shown in FIGS. 5A and 5B, fiber-reinforced composites 30 having anisotropy in thermal conductivity such as Cu—C, etc., are provided at an area for fixing a Thermo-module 12 on the base plate 11a of a package 11, whereby the fiber-reinforced composites 30 maybe disposed on the base plate 11a (a hermeticity retaining portion of the present invention) of a plate material having no ventilation property. That is, a hermeticity retaining portion having no ventilation property may be formed outside the area for fixing a Thermo-module 12. Metal materials such as a copper tungsten alloy (Cu—W), KOVAR (trademark of an Fe—Ni—Co alloy), etc., are applicable as a material for such a base plate 11a. And, sidewalls 11b are attached to the base plate 11a made of such a metal material, etc., to construct a package 11, whereby the hermeticity of the package 11 can be secured, and the abovementioned effects of the present invention can display remarkable performance.

Furthermore, an example of construction shown in FIG. 5A is such that an area of the base plate 11a, where a Thermo module 12 is fixed, is hollowed out, and fiber-reinforced composites 30 made of a plate of Cu—C, etc., are filled up in the hollowed-out portion, wherein the fiber-reinforced composites 30 are fixed on the base plate 11a by, for example, silver brazing. Also, an example of constructions shown in FIG. 5B is such that fiber-reinforced composites 30 are adhered to and fixed at the upper side of the base plate 11a, and a Thermo-module 12 is fixed on the fiber-reinforced complex material. FIG. 5B shows only the construction in the vicinity of the fixing portion of a Thermo-module 12 on the base plate 11a.

Figure 10A:
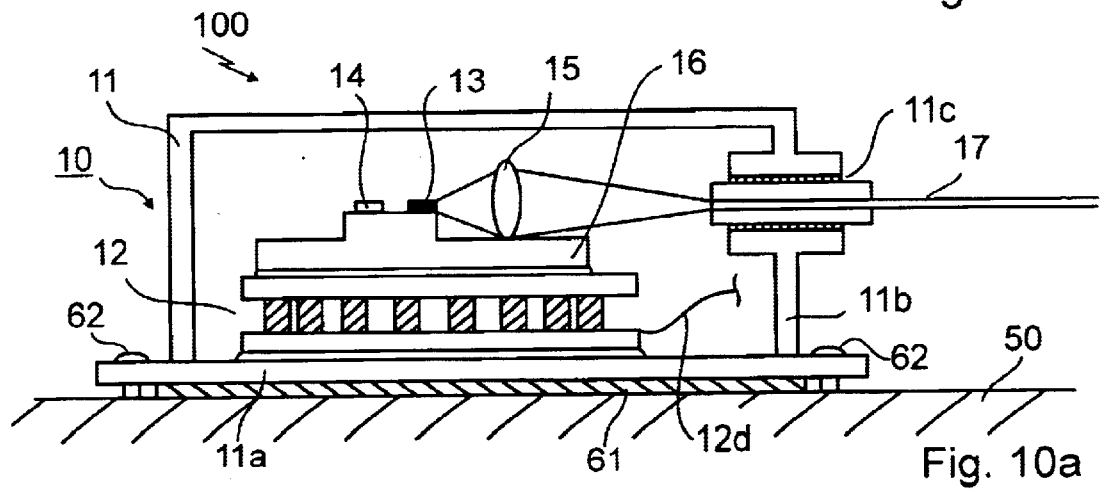
FIGS. 10A, 10B and 10C depict illustrations showing exemplary configurations of a mounting structure for a semiconductor laser module in the invention.
Figure 10B:
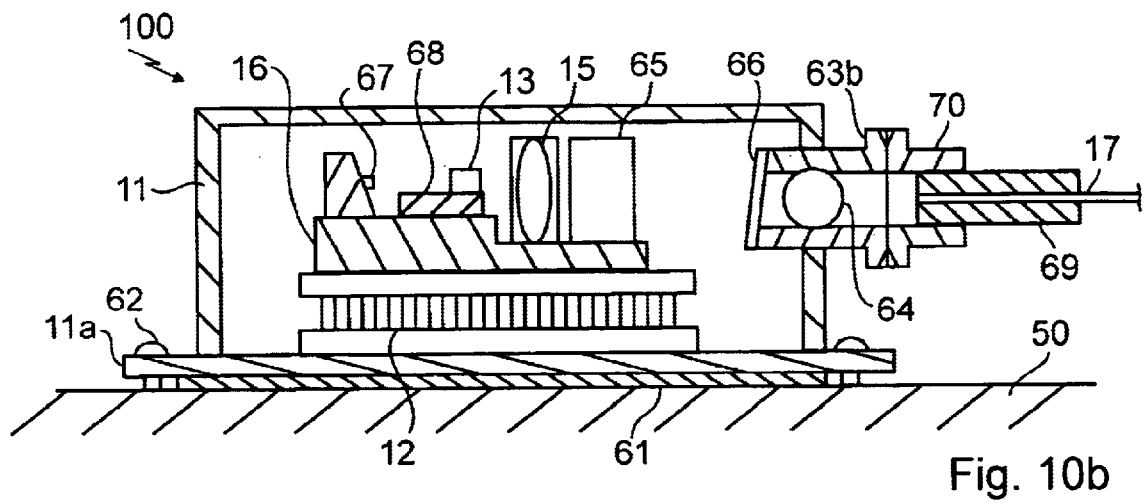

FIGS. 10A and 10B depict one example of a mounting structure for a semiconductor laser module 100. The semiconductor laser module 100 is fixed on a heat sink 50 functioning as a mounting substrate through a thermal diffusion sheet member 61 with screws 62.

Figure 10C:
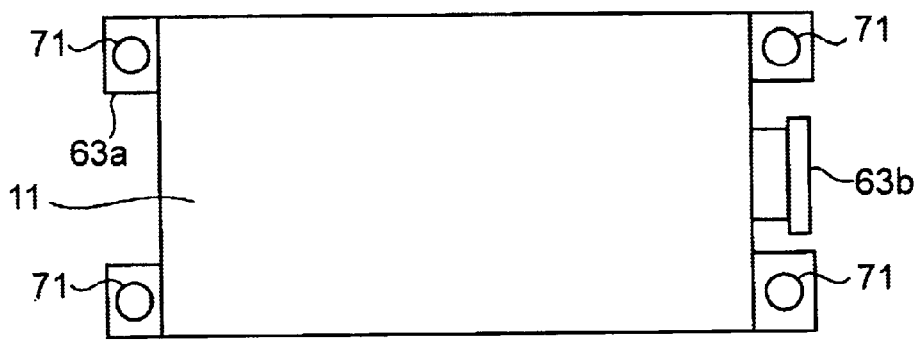

The semiconductor laser module 100 shown in FIG. 10B has a semiconductor laser chip 13, a first lens 15 and a second lens 64 to be optical components for transmitting laser light emitted from the semiconductor laser chip 13 to an optical fiber 17, and a package 11. The semiconductor laser chip 13, the first lens 15 and the second lens 64 are housed inside the package 11. The package 11 has a base plate 11a having an excellent thermal conductivity comprised of a Cu—W alloy, and four flanges of the base plate 11a are formed with screw holes 71 for inserting screws, respectively, as shown in FIG. 10C.

As the example shown in FIG. 10B, the semiconductor laser chip 13 is fixed to a chip mounting substrate 16 through a chip carrier 68 with solder. The under part of the chip mounting substrate 16 is fixed to a Thermo-module (TEC: Thermal Electric Cooler) 42, and the under part (under surface) of the Thermo-module 42 is fixed to the top surface of the base plate 11a of the package 11 with solder.

On the substrate 16, the first lens 15 and an optical isolator 65 are fixed. Inside a cylindrical part 63b projected on the side part of the package 11, the second lens 64 is fixed. Outside the cylindrical part 63b, the optical fiber 17 is fixed through a ferrule 69 and a sleeve 70. In FIG. 10B, a numeral 66 denotes a hermetic glass for transmitting through laser light, and a numeral 67 denotes a monitor photodiode for monitoring laser light outputted from the rear side of the semiconductor laser chip 13.

Near the semiconductor laser chip 13, the thermistor 14 (not shown in FIG. 10B) as shown in the aforesaid embodiment is disposed to detect temperature. It is the same as the aforesaid embodiment that the Thermo-module 12 is allowed to control temperatures detected by the thermistor constant.

In the semiconductor laser module 100 shown in FIG. 10B, laser light emitted from the front side of the semiconductor laser chip 13 is formed into collimated light by the first lens 15, it is condensed by the second lens 64 through the optical isolator 65 and the hermetic glass 66, and it is incidented into the optical fiber 17. Then, the laser light is transmitted along the optical fiber 17.

In the semiconductor laser module 100 shown in FIGS. 10A and 10B, the base plate 11a of the package 11 is mounted on the heat sink (chip mounting substrate) 50. More specifically, as shown in FIG. 10C, the screw holes 71 are disposed at four positions of the base plate 11a and the screws 62 are inserted into the screw holes 71 to be screwed to the heat sink 50, whereby the base plate 11a is fixed on the heat sink 50.

In the mounting structure for the semiconductor laser module 100, the thermal diffusion sheet member 61 is laid between the bottom surface of the base plate 11a of the package 11 and the top surface of the heat sink 50. The thermal diffusion sheet member 61 has thermal conductivity anisotropy where the thermal conductivity in the surface direction is greater than that in the thickness direction. Here, it is formed of graphite and has a thermal conductivity of 300 W/m·K or greater in the surface direction. More specifically, for example, PGS (Pyrolytic Graphite Sheet, trademark) can be used, which is produced by Matsushita Electronic Components Corporation, Japan.

As materials for the thermal diffusion sheet member 61 having thermal conductivity anisotropy, a fiber reinforced composite material having metal in matrix may be used as described above.

The use of such a sheet member having a high thermal diffusion in the surface direction allows desirable thermal diffusion characteristics to be secured from the semiconductor laser module 100 to the heat sink 50 even in the state where screw fastening torque is about 0.1 N·m, for example. When a sheet member having a low thermal diffusion is used, the semiconductor laser module 100 needs to be strongly pressed against the heat sink 50 to fasten screws for enhancing the thermal diffusion characteristics as much as possible. However, if so, a problem arises that the base plate 11a is warped and deformed to deteriorate the optical coupling efficiency of the semiconductor laser chip 13 to the optical fiber 17. In this point, the embodiment utilizes the sheet member having a high thermal diffusion in the surface direction and thermal diffusion characteristics required can be secured without strongly pressing the semiconductor laser module 100 against the heat sink 50. Therefore, a drop in an optical coupling factor of the semiconductor laser module 100 can be prevented due to the screw fastening torque of the screws 62 being set too high. Additionally, the screw fastening torque of the screws 62 is preferably set to 0.2 N·m or under, for example, in view of the deterioration of the optical coupling factor.

For example, in the mounting structure for the semiconductor laser module 100 of the embodiment, it was confirmed that when the optical coupling factor is about 80% before the screws 62 are fastened, the optical coupling factor is about 80% even after the screws are fastened and a high value almost the same as that before fastening the screws is maintained even after fastening the screws.

In the embodiment, the thermal diffusion sheet member 61 is formed to have a uniform thickness of 0.2 mm or under. The thermal diffusion sheet member 61 has thermal conductivity anisotropy and has the thermal conductivity in the thickness direction is lower than that in the surface direction. However, it is thinly formed to have a thickness of 0.2 mm or under, whereby the thermal diffusion from the semiconductor laser module 100 to the heat sink 50 is maintained excellently.

Figure 11:
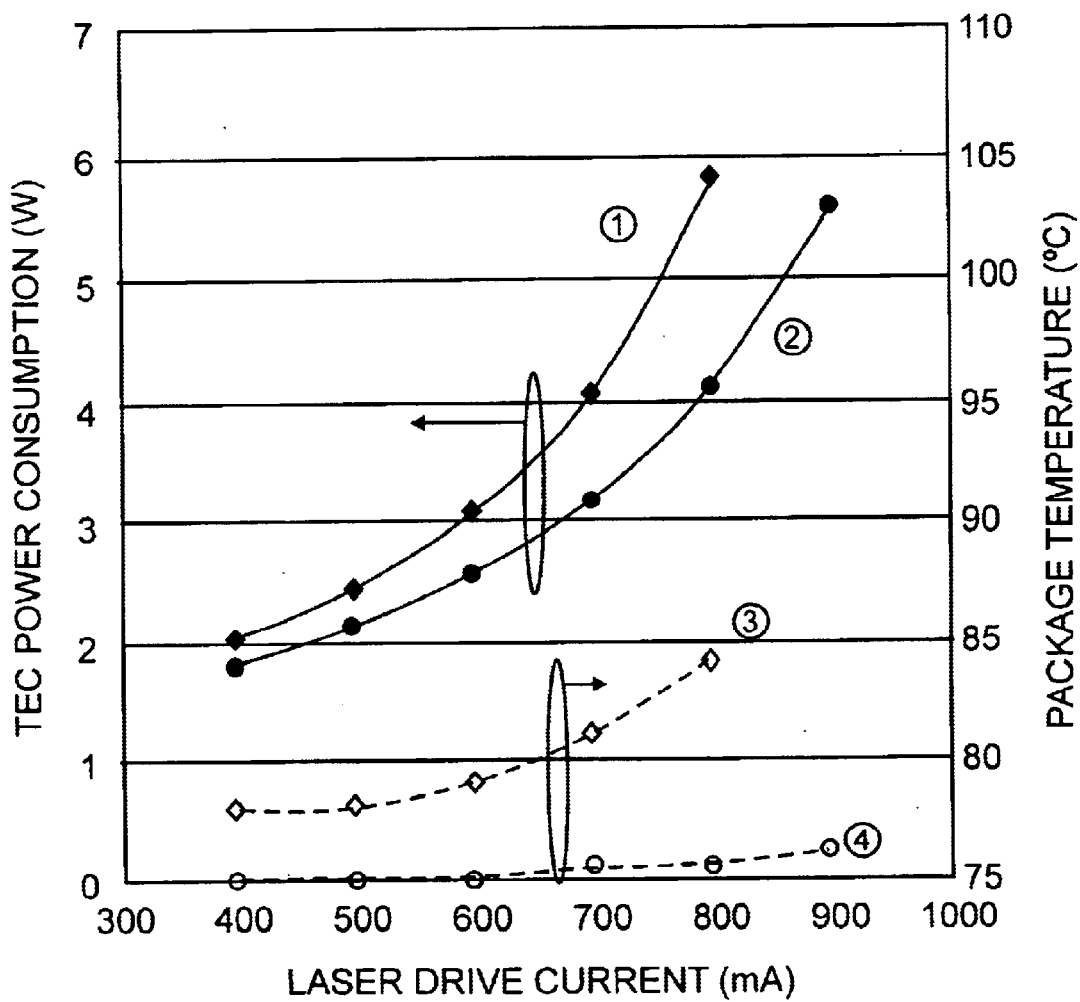
FIG. 11 depicts a graph showing the characteristics of the thermal diffusion of the mounting structure for the semiconductor laser module of the embodiment along with the characteristics of a comparative example.

FIG. 11 depicts a graph illustrating the experimental results of the characteristics for the thermal conductivity of the mounting structure for the semiconductor laser module 100 using such the thermal diffusion sheet member 61. A horizontal line shown in the drawing indicates the drive current (laser drive current) of the semiconductor laser chip 13 and a vertical line indicates the power consumption of the Thermo-module (TEC) 12 and changes in temperature of the package 11. The thermal diffusion sheet member 61 used in this experiment had a thermal conductivity of 600 W/m·K in the surface direction, a thermal conductivity of 5 W/m·K in the thickness direction, and a thickness of 0.1 mm.

Additionally, the experimental results where a silicone resin sheet member having thermal conductivity isotropy was used are also shown in the graph as a comparative example. The silicone resin sheet member of the comparative example used had a thermal conductivity of 10 W/m·K and dimensions of 13 mm in wide, 30 mm in height and 0.1 mm in thickness. The size of the sheet dimensions is the same as that of the embodiment. Furthermore, temperature of the package 11 is considered to be 75° C. on the heat sink 50 side. Moreover, the semiconductor laser module 100 is screwed to the heat sink 50 at four positions with the screws 62 of the JIS standard value M2, and the screw fastening torque was set to 0.1 N·m, respectively.

In FIG. 11, a curve of Circled 1 indicates changes in the power consumption of the Thermo-module 12 in the comparative example, a curve of Circled 2 indicates the power consumption of the Thermo-module 12 in the embodiment, a curve of Circled 3 indicates changes in temperature of the package 11 in the comparative example, and a curve of Circled 4 indicates changes in temperature of the package 11 in the embodiment, respectively.

According to the curves of Circled 1 and 2, it was revealed that the power consumption of the Thermo-module 12 in the embodiment becomes lower by about 25% than the comparative example. Additionally, according to the curves of Circled 3 and 4, it was revealed that the changes in temperature of the package 11 in the embodiment are about 1° C., which shows almost no changes, as compared with the comparative example where the temperature difference of 10° C. is generated at the maximum. More specifically, it was revealed that a great thermal resistance exists between the semiconductor laser module 100 and the heat sink 50 in the comparative example, whereas the embodiment only has a low thermal resistance of one-tenth or under of the comparative example.

Furthermore, the deterioration of the optical coupling factor was hardly generated in the screw fastening torque as described above. Even though the screw fastening torque is set stronger than this, it will be expected that the use of the thermal diffusion sheet member 61 of the embodiment can suppress the deterioration of the optical coupling efficiency more than the comparative example can.

As apparent from the experimental results, according to the mounting structure for the semiconductor laser module 100 of the embodiment, the thermal diffusion from the semiconductor laser chip 13 is enhanced and the mounting structure for the semiconductor laser module having a high optical coupling factor can be formed. Particularly, the semiconductor laser module used as a pumping light source for an optical fiber amplifier has been required for increases in optical output year by year; a high output module industrially usable up to 300 mW or greater is demanded recently.

It will be difficult to realize such the high output module when either the thermal diffusion characteristics or the optical coupling factor are not excellent, even though the current technique of enhancing output of the semiconductor laser chip 13 and the assembling technique of the semiconductor laser chip 13 are used. Thus, it is significantly effective to use the structure of the embodiment as the mounting structure for the semiconductor laser module that a high optical output of 300 mW or greater is demanded.

Figure 12:
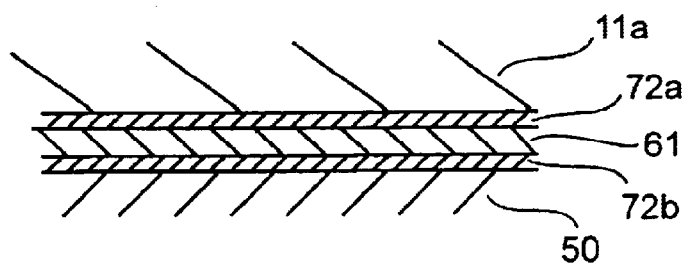
FIG. 12 depicts an illustration of another embodiment of the mounting structure of the semiconductor laser module.

In addition, there can be the case where the flatness of the surface of the package 11 or heat sink 50 facing to the thermal diffusion sheet member 61 is not good. In this case, as shown in FIG. 12, resin layers 72a and 72b comprised of acrylic resin, polyimide resin or silicone resin are formed either between the thermal diffusion sheet member 61 and the package 11 or between the thermal diffusion sheet member 61 and the heat sin 50, or both (it is both in the example shown in FIG. 12). By doing so, minute gaps that can be generated between the thermal diffusion sheet member 61 and the semiconductor laser module 100 or heat sink 50 are buried, whereby the thermal diffusion from the semiconductor laser module 100 to the heat sink (mounting substrate) 50 can further be enhanced.

When such the resin layers 72 and 72b are too thick, it causes the thermal diffusion from the semiconductor laser chip 13 to drop. Therefore, the total thickness of the resin layers 72a and 72b is preferably 0.05 mm or under for securing the thermal diffusion. Furthermore, the resin layers 72a and 72b preferably have a high viscosity so as not to flow over other portions of the heat sink 50.

Figure 13:
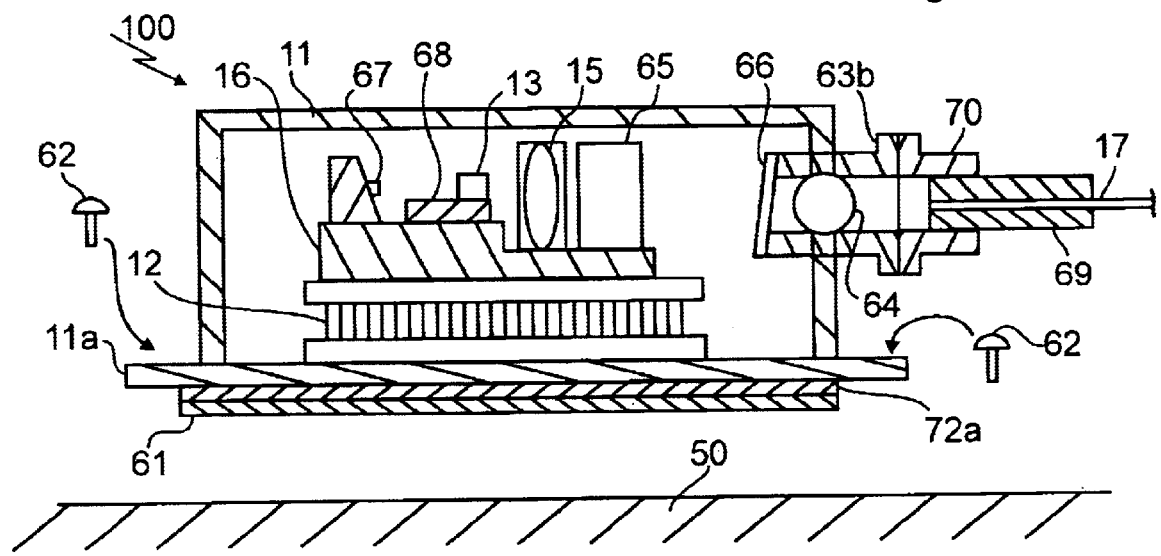
FIG. 13 depicts an illustration of still another embodiment of the mounting structure for the semiconductor laser module.

FIG. 13 depicts another embodiment of the mounting structure for the semiconductor laser module 100. The configuration of the semiconductor laser module 100 may be acceptable with any of those shown in FIGS. 10A and 10B, but the type shown in FIG. 10B is illustrated as a typical example in FIG. 13. In the embodiment shown in FIG. 13, the resin layer 72a between the thermal diffusion sheet member 61 and the semiconductor laser module 100 has adhesion. The adhesion of the resin layer 72a is utilized to further combine the semiconductor laser module 100 with the thermal diffusion sheet member 61 beforehand.

For example, graphite is a material hardly having adhesion for the thermal diffusion sheet member 61. When the thermal diffusion sheet member 61 is attached and fixed to the semiconductor laser module 100 with a resin layer 72a having adhesion, it is preferable because the workability becomes excellent in packaging the semiconductor laser module 100 on the heat sink 50. It is also possible to attach and fix the thermal diffusion sheet member 61 to the heat sink 50 side with a resin layer having adhesion in advance. Also in this case, the packaging workability of the semiconductor laser module 100 can be improved.

Additionally, in the mounting structure for the semiconductor laser module in the invention, the configuration of the semiconductor laser module 100 packaged on the mounting substrate is not limited to those shown in FIGS. 10A and 10B. For instance, the semiconductor laser module 100 shown in FIG. 10A uses one lens to couple laser light from the semiconductor laser chip 13 to the optical fiber 17, and the semiconductor laser module 100 shown in FIG. 10B uses two lenses to couple laser light from the semiconductor laser chip 13 to the optical fiber 17. However, the number of lenses used is not defined; it may be acceptable to directly introduce light from the semiconductor laser chip 13 into the optical fiber 17 without using the lenses 15 and 64, for example. Additionally, the semiconductor laser module 100 may have the configuration where the semiconductor laser chip 13 is housed inside the package 11 and heat diffused from the semiconductor laser chip 13 is exhausted to the base plate 11a side of the package 11. The configuration inside the package 11 is not defined to those of the embodiments.

Furthermore, the semiconductor laser module 100 packaged on the heat sink 50 has the Thermo-module 12 housed inside the package 11, but the semiconductor laser module not using the Thermo-module 12 may be acceptable. In this case, the chip mounting substrate 16 is directly fixed to the top surface of the base plate 11a with solder.

Moreover, in each of the examples, the heat sink 50 was used as the substrate on which the semiconductor laser module 100 is packaged, but the semiconductor laser module 100 may be packaged on a mounting substrate other than the heat sink.

Besides, the method for fixing the semiconductor laser module 100 to the mounting substrate (heat sink) is not defined to screw fastening. It may be provided with a mechanism of pressing the flanges formed on the base plate 11a against the mounting substrate from above with those other than the screws. Alternatively, the semiconductor laser module 100 may be attached and fixed with no screws.

In the case of using screw fastening, the contact of the semiconductor laser module 100 with the mounting substrate (heat sink) becomes excellent in surface to surface, and thus the thermal diffusion can be secured. However, it is preferable to have a smaller contact of the semiconductor laser module 100 with the mounting substrate in surface to surface in view of preventing the deterioration of the optical coupling factor of the semiconductor laser module 100.

In this manner, the thermal diffusion effect is enhanced due to the use of the resin layers 72a and 72b as the contact of the semiconductor laser module 100 with the mounting substrate in surface to surface becomes smaller. Therefore, it is further preferable to attach and fix the semiconductor laser module 100 to the mounting substrate with the resin layers 72a and 72b.

Figure 14A:
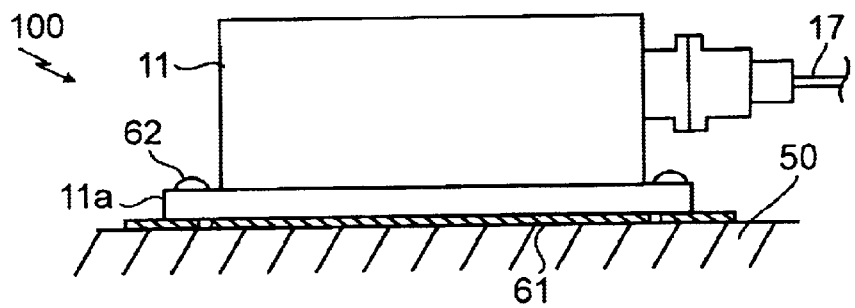
FIGS. 14A and 14B depict illustrations other embodiments of other arrangement forms of a thermal diffusion sheet member.
Figure 14B:
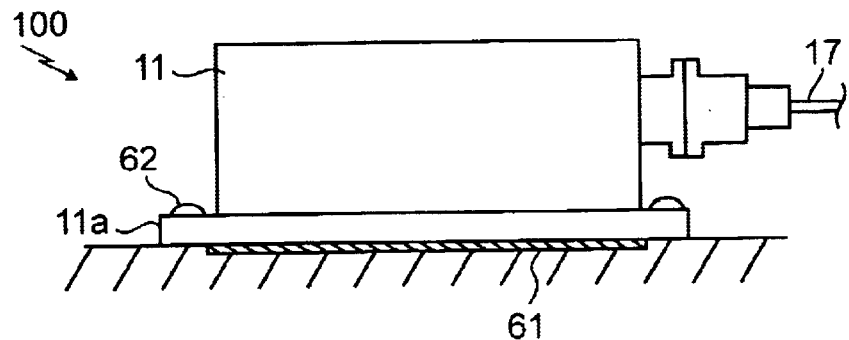

In addition, the thermal diffusion sheet member 61 having an area greater than the base area of the semiconductor laser module 100 may be used as shown in FIG. 14A. Alternatively, as shown in FIG. 14B, it may have the structure where a recessed part is disposed in the top surface of the mounting substrate (heat sink) 50 and the thermal diffusion sheet member 61 is housed inside the recessed part. Accordingly, the thermal diffusion sheet member 61 may be laid between the bottom surface of the semiconductor laser module 100 and the top surface of the mounting substrate; the form to be laid is not defined to those in the embodiments.

What is claimed is:

1. A mounting structure comprising:
   a semiconductor laser module;
      a mounting substrate for mounting the semiconductor laser module;
      and a thermal diffusion sheet member disposed between the semiconductor laser module and the mounting substrate:
         wherein the semiconductor laser module comprises a semiconductor laser chip mounted on a chip mounting substrate, a thermo-module configured to cool the semiconductor laser chip, and a package having a bottom plate and housing the semiconductor laser chip and the thermo-module, the thermo-module being interposed between the bottom plate of the package and the chip mounting substrate; and
         wherein the thermal diffusion sheet member is disposed between the bottom plate of the package and a surface of the mounting substrate, the thermal diffusion sheet member having an anisotropic thermal conductivity such that the thermal conductivity along a direction in a sheet surface is higher than along a thickness direction; and,
   wherein the semiconductor laser module, the thermal diffusion sheet member and, the mounting substrate are in thermal communication with each other.

2. The mounting structure according to claim 1, wherein the thermal diffusion sheet member is a graphite sheet member having a thermal conductivity of at least 300 W/m·K in the sheet surface.

3. The mounting structure according to claim 1, wherein the thermal diffusion sheet member is formed of a fiber reinforced composite material having metal as matrix.

4. The mounting structure according to claim 1, wherein a thickness of the thermal diffusion sheet member is 0.2 mm or less.

5. The mounting structure according to claim 1, wherein a resin layer is formed at least one of the thermal diffusion sheet member and a bottom plate of the package and between the thermal diffusion sheet member and a surface of the mounting substrate.

6. The mounting structure according to claim 5, wherein a total thickness of the resin layer is 0.05 mm or less.

7. The mounting structure according to claim 5, wherein the resin layer is an adhesive layer by which the thermal diffusion sheet member is adhered to at least one of the bottom plate of the package and the surface of the mounting substrate.

8. The mounting structure according to claim 1, wherein the semiconductor laser chip emits an optical output of at least 300 mW.

9. A mounting structure comprising:

a semiconductor laser module;

a mounting substrate for mounting the semiconductor laser module; and a thermal diffusion sheet member disposed between the semiconductor laser module and the mounting substrate: wherein the semiconductor laser module comprises a semiconductor laser chip mounted on a chip mounting substrate;

and a package having a bottom plate, and housing the semiconductor laser chip and the chip mounting substrate; and wherein the thermal diffusion sheet member is disposed between a bottom plate of the package and a surface of the mounting structure, the thermal diffusion sheet member having an anisotropic thermal conductivity such that the thermal conductivity along a direction in a sheet surface is higher than along a thickness direction; and, wherein the semiconductor laser module, the thermal diffusion sheet member and, the mounting substrate are in thermal communication with each other.

10. The mounting structure according to claim 1, wherein a heat sink is formed to be the mounting substrate.

11. The mounting structure according to claim 9, wherein a heat sink is formed to be the mounting substrate.

12. The mounting structure according to claim 1, wherein the bottom plate of the semiconductor laser module is screwed to the mounting substrate with a torque less than 0.1 Nm.

13. The mounting structure according to claim 9, wherein the bottom plate of the semiconductor laser module is screwed to the mounting substrate with a torque less than 0.1 Nm.

* * * * *